United States Patent
Koivuluoma et al.

(10) Patent No.: US 9,247,671 B2
(45) Date of Patent: Jan. 26, 2016

(54) METHOD AND ARRANGEMENT FOR REDUCING THE AMOUNT OF CONDENSED MOISTURE INSIDE AN ENCLOSURE FOR ELECTRICAL EQUIPMENT

(71) Applicant: ABB OY, Helsinki (FI)

(72) Inventors: Timo Koivuluoma, Helsinki (FI); Jukka Tiittanen, Helsinki (FI); Marko Harju, Helsinki (FI)

(73) Assignee: ABB OY, Helsinki (FI)

( * ) Notice: Subject to any disclaimer, the term of this patent is extended or adjusted under 35 U.S.C. 154(b) by 384 days.

(21) Appl. No.: 13/679,009

(22) Filed: Nov. 16, 2012

(65) Prior Publication Data

US 2013/0128454 A1 May 23, 2013

(30) Foreign Application Priority Data

Nov. 17, 2011 (EP) .................................. 11189582

(51) Int. Cl.
| | |
|---|---|
| *H05K 5/00* | (2006.01) |
| *G06F 1/16* | (2006.01) |
| *H05K 7/00* | (2006.01) |
| *H05K 7/20* | (2006.01) |
| *H05K 5/02* | (2006.01) |

(52) U.S. Cl.
CPC ................ *H05K 7/20* (2013.01); *H05K 5/0213* (2013.01)

(58) Field of Classification Search
CPC .................................. G06F 1/20; G06F 1/206
USPC .......... 361/691, 692, 679.53; 62/259.2, 259.4
See application file for complete search history.

(56) References Cited

U.S. PATENT DOCUMENTS

| | | | | |
|---|---|---|---|---|
| 7,441,412 | B2 * | 10/2008 | Jensen ............................ | 62/121 |
| 7,905,096 | B1 | 3/2011 | Campbell et al. | |
| 8,289,709 | B2 * | 10/2012 | Feltner et al. ................. | 361/695 |
| 2005/0217299 | A1 * | 10/2005 | Chu et al. ..................... | 62/259.2 |
| 2009/0273902 | A1 * | 11/2009 | Kato et al. .................... | 361/692 |
| 2010/0313584 | A1 * | 12/2010 | Lopez et al. ................... | 62/171 |
| 2011/0030388 | A1 | 2/2011 | Johansson et al. | |

FOREIGN PATENT DOCUMENTS

| | | |
|---|---|---|
| DE | 202007006592 U1 | 9/2007 |
| WO | 2006/053937 A1 | 5/2006 |

OTHER PUBLICATIONS

European Search Report issued on May 4, 2012 by the European Patent Office, in corresponding European Patent Application No. 11189582.

* cited by examiner

*Primary Examiner* — Anthony Haughton
(74) *Attorney, Agent, or Firm* — Buchanan Ingersoll & Rooney PC

(57) ABSTRACT

A method and arrangement are provided for reducing the amount of condensed moisture inside an enclosure which encloses at least one piece of electrical equipment which is configured to receive electric power from outside the enclosure in a first electrical magnitude range ($0 \ldots \max_{input}$) and to feed electric power to outside the enclosure in a second electrical magnitude range ($\min_{output} \ldots \max_{output}$). Electric power received on at least one portion (a, b, c) of the first electrical magnitude range ($0 \ldots \max_{input}$) being outside the second electrical magnitude range ($\min_{output} \ldots \max_{output}$) is utilized for heating the condensed moisture for exhaustion thereof.

33 Claims, 2 Drawing Sheets

METHOD AND ARRANGEMENT FOR REDUCING THE AMOUNT OF CONDENSED MOISTURE INSIDE AN ENCLOSURE FOR ELECTRICAL EQUIPMENT

RELATED APPLICATION

This application claims priority under 35 U.S.C. §119 to European Patent Application No. 11189582.7 filed in Europe on Nov. 17, 2011, the entire content of which is hereby incorporated by reference in its entirety.

FIELD

The present disclosure relates to dehumidification of enclosures for enclosing electrical equipment. More particularly, the present disclosure relates to exhausting condensed moisture inside outdoor cabinets which are designed for storing electrical equipment, such as inverters for solar panels, for example.

BACKGROUND INFORMATION

Enclosures for storing electrical equipment are designed to protect the equipment from exposure to outdoor conditions. The enclosures provide protection against rain, low and high temperatures as well as impacts. In outdoor use, enclosures for enclosing electrical equipment are exposed to cyclic temperature changes between day and night. While such enclosures are designed to be waterproof, this cyclic heat load causes moisture to accumulate in the inner surfaces of the enclosure. When the temperature outside the enclosure, such as an electrical cabinet, is sufficiently much lower than the temperature within the enclosure, then there is a risk of condensation on the inner surfaces of the enclosure. Condensation will ultimately result in water to drop down onto the electrical equipment installed in the enclosure and therefore drop the maximum voltage of or damage the electrical equipment.

This issue is especially pertinent in applications where the electrical equipment inside the enclosure is switched on occasionally or cyclically. A particular example of this is a solar inverter in a photovoltaic (PV) system including a number of solar panels or modules, which operates cyclically for natural reasons. In daytime, the PV system is in operation converting solar energy from the sun for use by a utility grid. When the sun sets or when the solar panels are not able to generate enough power, the inverter is switched off completely. Further reasons for switching off the inverter include saving energy, maintenance and outages in the power grid. The cyclic operation of the inverter causes problems relating to the temperature and humidity inside the enclosure, wherein during cold periods of the diurnal rhythm, temperature inside the enclosure provides for a window of opportunity for moisture to condensate to inside the enclosure.

The condensation phenomenon may be solved by providing the enclosure with an auxiliary heater, such as a resistance thermal element, whose purpose is to maintain the inner temperature above outside temperature such that no moisture may condensate on the inner surfaces of the enclosure. However, this approach has the drawback of wasting energy, reducing the lifetime of electrical components and exposing the equipment inside to a constant heat stress which may take some components outside specification, for example, outside appropriate operating temperature range.

Another solution would be to condense the moisture with an air dryer or a Peltier element for turning the moisture into a running liquid which may be lead out of the enclosure through outlets. In outdoor use, however, such an opening in the enclosure would in the course of time accumulate undesirable growth, such as algae etc. More specifically, the outlet valve of such an arrangement would be vulnerable to the impurities of the condensed liquid. The problem of an open system is emphasized in remote locations, such as deserts and jungles. Should the problem of an open system be solved by waterproofing the enclosure, one would encounter the original problem of condensed moisture inside the hermetically closed enclosure.

SUMMARY

An exemplary embodiment of the present disclosure provides a method for reducing an amount of moisture condensed inside an enclosure enclosing at least one piece of electrical equipment which is configured to receive electric power from an external power source supplying output power in a first electrical magnitude range and which feeds electric power to an external power recipient configured to receive electric power from the electrical equipment in a second electrical magnitude range. The exemplary method includes utilizing electric power received on at least one portion of the first electrical magnitude range outside the second electrical magnitude range for heating the condensed moisture to exhaust the condensed moisture.

An exemplary embodiment of the present disclosure provides an arrangement for reducing the amount of moisture condensed to inside an enclosure enclosing at least one piece of electrical equipment which is configured to receive electric power from an external power source supplying output power in a first electrical magnitude range and to feed electric power to an external power recipient being configured to receive electric power from the electrical equipment in a second electrical magnitude range. The exemplary arrangement includes a boiler configured to collect and exhaust the moisture. The boiler includes a receptacle configured to collect condensed moisture from inside the enclosure, means for channeling the condensed moisture from inside the enclosure to the receptacle, heating means arranged to the receptacle for heating the moisture there within, and an outlet configured to exhaust the heated moisture from the receptacle to outside the arrangement. In addition, the exemplary arrangement includes a controller which is configured to direct electric power received by the electrical equipment on at least one portion of the first electrical magnitude range being outside the second electrical magnitude range for heating the condensed moisture for exhaustion thereof.

BRIEF DESCRIPTION OF THE DRAWINGS

Additional refinements, advantages and features of the present disclosure are described in more detail below with reference to exemplary embodiments illustrated in the drawings, in which.

DETAILED DESCRIPTION

Figure 1:
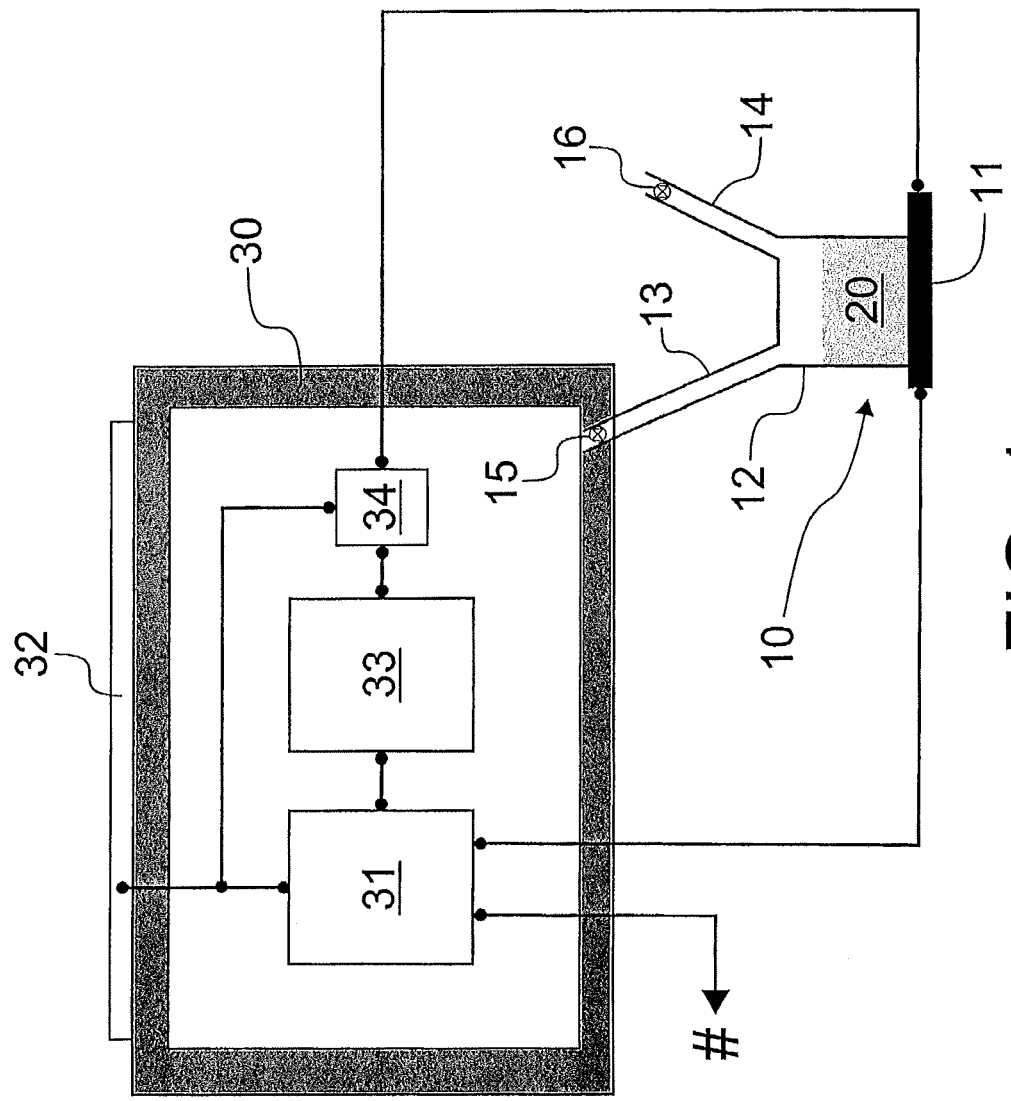
FIG. 1 presents a cross-section view of an arrangement according to an exemplary embodiment of the present disclosure.

Exemplary embodiments of the present disclosure provide a method and arrangement for reducing the amount of condensed moisture inside an outdoor enclosure for electrical equipment such that the equipment may be protected against exposure to moisture by using a minimal amount of energy.

An exemplary embodiment of the present disclosure provides a method for reducing the amount of moisture condensed to inside an enclosure enclosing at least one piece of electrical equipment which is configured (e.g., structurally and/or functionally adapted) to receive electric power from outside the enclosure in a first electrical magnitude range and to feed electric power to outside the enclosure in a second electrical magnitude range. In the method, electric power received on at least one portion of the first electrical magnitude range being outside the second electrical magnitude range is utilized for heating the condensed moisture for exhaustion thereof.

An exemplary embodiment of the present disclosure provides an arrangement for reducing the amount of moisture condensed to inside an enclosure which encloses at least one piece of electrical equipment for receiving electric power from outside the enclosure in a first electrical magnitude range and feeding electric power to outside the enclosure in a second electrical magnitude range. The arrangement is configured to utilize electric power received on at least one portion of the first electrical magnitude range being outside the second electrical magnitude range for heating the condensed moisture for exhaustion thereof.

Considerable benefits are gained with the aid of the present disclosure.

Because electric power, which is received outside the output range, is used for heating the condensed moisture, no excess energy is required to exhaust condensed moisture. Furthermore, as the moisture is specifically heated instead the inner volume of air within the enclosure, the moisture is vaporized leading to very efficient exhaustion. In other words, the risk of condensed moisture causing failures in the electrical equipment inside the enclosure is minimized with essentially no excess power use, which therefore improves the efficiency of the equipment.

An exemplary advantageous benefit is gained in solar panel (e.g., photovoltaic cell) applications, for example, wherein generated excess electricity is used for exhausting the moisture. In practice, solar cells may be dimensioned such that during the day, when the cell absorbs most sunlight, the power grid is fed at a top input rate. However, while the power grid receives power at top rate, the solar cell is operating below its top output. The same applies to situations where the solar cell has an output which is below the bottom input rate of the power grid. In both cases, the excess energy produced by the oversized solar cell may be used to remove the moisture.

Generally speaking, particular benefits are gained with applications wherein the equipment inside the enclosure is an inverter or similar for receiving electric power from a power source, which has recovered the electric power from another form of energy, such as solar, wind, heat or kinetic energy, and feeding the electric power to outside the enclosure.

According to an exemplary embodiment of the present disclosure, the enclosure is a substantially closed outdoor container, and the moisture is collected to a receptacle of a boiler which is provided with a heating device. The moisture collected into the receptacle is heated with the heating device to at least the boiling temperature of the moisture, and the exhausted moisture is sterilized. As a result, no growth is accumulated onto the outlet of the system.

According to an exemplary embodiment, the moisture inside the enclosure is collected to a receptacle of a boiler provided with an electric heating resistor which is configured to heat the moisture in the receptacle. By using an electric heating resistor, it is possible to easily determine an optimal period of time for launching generation of electricity. Such a determination may be established by measuring the power consumption of the electric heating resistor, wherein the power consumption indicates how much electricity is currently being generated.

In accordance with an exemplary embodiment, the enclosure within the context of the present disclosure may be understood to be any enclosure which may be used to receive and contain electrical equipment and to protect the equipment against environmental impacts, such as rain. As can be seen from FIG. 1, one example of an enclosure according to the present disclosure is an enclosure 30 for enclosing solar panel equipment, such as an inverter 31. Other conceivable enclosures include heavy containers and shelters as well as buildings and vehicles. According to an exemplary embodiment, the enclosure 30 is an outdoor enclosure containing an inverter 31 for converting received electric power. The enclosure 30 is arranged such that the inverter 31 receives electric power from an external power source, for example, from a power source which is located at least partially outside the enclosure 30. According to an exemplary embodiment, the external power source may be a solar panel 32 which has been provided outside the enclosure 30 to recover solar energy and to feed electric power, for example, direct current (DC), to inside the enclosure 30, wherein the electric power is received by the inverter 31. According to an exemplary embodiment, the power source is a hydraulic turbine. According to yet another embodiment, the power source is a dynamometer. According to a further embodiment, the power source is a wind turbine. The power source is nevertheless an energy converter converting energy in one form to electric power.

In addition to the inverter 31, the enclosure 30 encloses a controller 33 which is connected to the inverter 31 for control thereof. The inverter 31 is further connected to the outside power source (e.g. a solar panel 32), wherein the inverter 31 is configured to receive electric power from outside the enclosure 30 in a first electrical magnitude range and to feed electric power to outside the enclosure 30 in a second electrical magnitude range. In accordance with an exemplary embodiment, the inverter 31 is configured to convert direct current (DC) received on a specific voltage range to alternating current which is fed in a voltage range which may differ or be the same as the voltage range of the received direct current. Naturally, the inverter 31 may be configured to perform also other kinds of conversions. In the example of FIG. 1, however, the inverter 31 is configured to receive direct current from the solar panel 32 and to feed converted alternating current to external power grid #. Naturally, the inverter 31 may be configured to feed an alternative power recipient, such as a battery or an electrical appliance. The first and second magnitude ranges are discussed in greater detail in connection with embodiments of the method according to the present disclosure.

Figure 2:
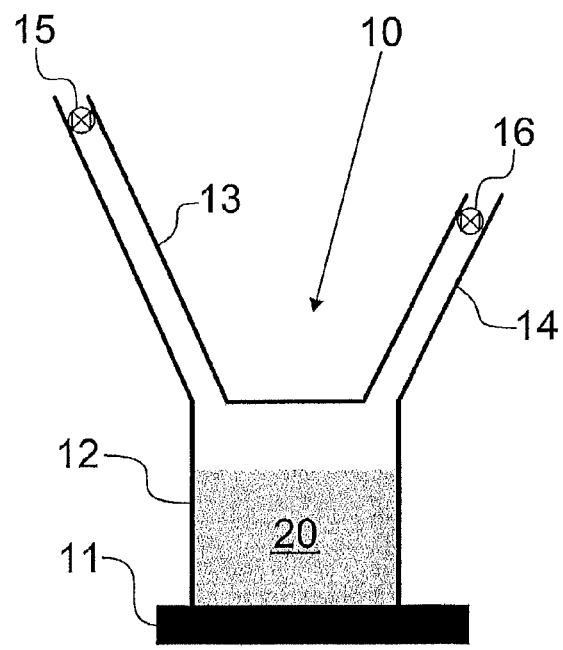
FIG. 2 presents a detailed view of the enclosure of FIG. 1.

The enclosure 30 is also provided with a boiler 10 for collecting and exhausting moisture which has condensed inside the enclosure 30 due to phenomena described above. In the example of FIGS. 1 and 2, the boiler 10 is an external device arranged mostly outside the enclosure 30 and being connected thereto to create a closed system by virtue of a tight joint. Moreover, the enclosure 30 may be a substantially closed outdoor container, wherein liquid flows in and out of the enclosure are controlled. In other words, the enclosure 30 does not leak or is not open to external fluids, wherein the enclosure is waterproof. The boiler 10 may alternatively be arranged as an internal device arranged within the enclosure 30.

The boiler 10 includes a receptacle 12 for collecting condensed moisture 20 from inside the enclosure 30. The boiler 10 further includes means for channeling the condensed moisture 20 from inside the enclosure 30 to the receptacle 12. According to the example of FIGS. 1 and 2, the channeling means includes an inlet 13, which is a tube connecting the inner volume of the enclosure 30 to the receptacle 12 of the boiler 10. The inlet 13 may be sealed to both the enclosure 30 as well as to the receptacle 12 such that no fluid 20 may escape from the closed system. The boiler 10 also includes an outlet 14 which is another tube connecting the receptacle 12 to the atmosphere or at least outside the enclosure 30. The outlet 14 is provided with a valve 16 for controlling the exhaustion of liquid 20 from the receptacle 12. The inlet 13 may be provided with a valve 15 for controlling the reception of liquid 20. According to an exemplary embodiment, either or both valves 15, 16 are simple flap valves which open and close upon changes in pressure within the boiler 10. According to an exemplary embodiment, either or both valves 15, 16 are controllable solenoid valves which may be controlled by the controller 33. A skilled person is, however, able to conceive further feasible alternatives.

The boiler 10 further includes means for heating the liquid 20 collected into the receptacle 12 in order to exhaust the liquid by facilitating evaporation thereof. The means for heating is a heating device 11 which is arranged in thermal connection with the receptacle such that the device is configured to heat the contents, for example, liquid 20, in the receptacle 12. According to an exemplary embodiment, the heating device is an electrical heater resistor 11 which is configured to heat the liquid 20 inside the receptacle 12.

The dehumidification arrangement is arranged to utilize electric power received from the external power source 32 for heating the collected condensed moisture 20, wherein the moisture 20 is exhausted by facilitating evaporation thereof. There are, however, a variety of ways of directing the electric power to the boiler 10. According to an exemplary embodiment, the electrical heater resistor 11 is directly connected to the inverter 31 (FIG. 1). In the embodiment, the controller 33 regulates the inverter 31 to supply electric power to the electrical heater resistor 11 instead of or in addition to the external power grid # or other recipient of electric power. According to another embodiment, the electrical heater resistor 11 is also or alternatively connected to a bypass 34 for bypassing the inverter 31. With aid of the inverter bypass 34, electric power may be supplied to the electrical heater resistor 11 directly from the external power source 32. In the example of FIG. 1, direct current produced by the solar panel 32, is directed by the controller 33 to the electrical heater resistor 11 via the inverter bypass 34. The bypass 34 may be constructed in a variety of ways. A simple construction would be a mere electrically controllable switch. As can be seen from FIG. 1, also a combination of these embodiments is possible.

Figure 3:
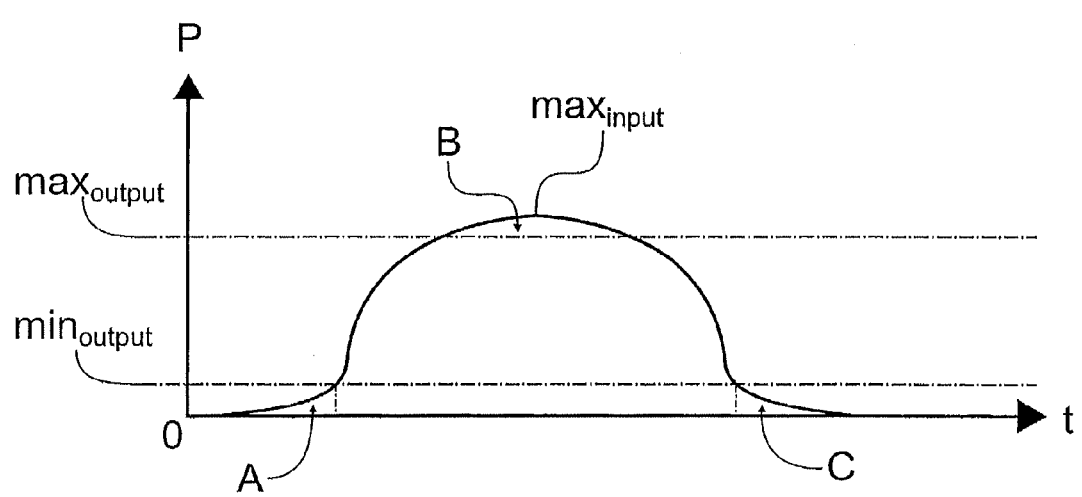
FIG. 3 presents a diagram of a power range outside of which recovered energy is used for exhausting moisture from inside the enclosure.

The novel arrangement provides for a novel method of dehumidification of an electrical equipment enclosure designed for outdoor use. The principle according to an exemplary embodiment of the method is illustrated in FIG. 3 which presents the power supply diagram of a solar panel 32 as depicted above. As can be seen from FIG. 3, the power output of a solar panel varies depending on the time of the day, for example, depending on the amount of received sunshine. As is also apparent from FIG. 3, the power output is cyclic during a period of several consecutive days. When examining a single period of 24 hours (FIG. 3), one may observe that the power output of a solar panel increases gradually and reaches a high point in the middle of the day. A similar descending curve may be observed in the amount of output power and received sunlight as the night approaches.

Therefore it may be concluded that power is received into the enclosure 30 in a first electrical magnitude range. In the example above, the electrical magnitude is power, for example, the output power of the solar panel 32. The electrical magnitude may alternatively be selected as voltage, frequency, current, a combination thereof or some other indicative value. However, the first electrical magnitude range according to the embodiment of FIGS. 1 and 3 is 0 to $max_{input}$. While the solar panel 32 produces electric power on a first electrical magnitude range, electric power supplied to outside the enclosure 30 is supplied on a second electrical magnitude range which may be different from the first. According to the exemplary embodiment of FIGS. 1 and 3, the power output of the inverter 31 is limited to a range of $min_{output}$ to $max_{output}$ which range forms the second electrical magnitude range. The limitation is due to limitations in the receiving power grid # being configured to only receive electric power on a specific power range. In such a solar power application, the external power grid # is being supplied with a constant alternating current, whereby the output voltage of the inverter 31 varies according to the output voltage of the solar panel 32.

Accordingly, electric power is being received into the enclosure 30 on portions A, B and C of the first electrical magnitude range 0 to $max_{input}$ which portions A to C are outside the second electrical magnitude range $min_{output}$ to $max_{output}$. In the exemplary embodiment, the electric energy received on the portions A to C is used for heating the condensed moisture for exhaustion thereof. Upon closer inspection, portion A is formed by the electric energy recovered in the morning when the output power P of the solar panel 32 has not exceeded the minimum input power $min_{output}$ of the power grid #. Portion B is formed by the electric energy recovered at noon when the output power P of the solar panel 32 exceeds the maximum input power $max_{output}$ of the power grid #. Portion C is formed by the electric energy recovered in the evening when the output power P of the solar panel 32 is below the minimum input power $min_{output}$ of the power grid #. It is to be understood that legends $min_{output}$ and $max_{output}$ of FIG. 3 refer to power entering and leaving the enclosure 30. The terms input and output are therefore used to describe directions relative to the enclosure 30.

Generally speaking, the portions of the first electrical magnitude range outside the second electrical magnitude range may be formed by different means. For example, such a portion may be formed during output power peaks in a hydroelectric power station or during scheduled or non-scheduled outages in the receiving power grid.

In any case, electric power received to the enclosure 30 on at least one of the portions A to C is fed to the heating device, for example, the electrical heater resistor 11, through the inverter 31 or directly from the power source 32. The collected moisture 20 within the receptacle 12 may be heated to at least the boiling temperature of the moisture. In accordance with an exemplary embodiment, the moisture 20 may be exhausted by boiling as the exhausted moisture is sterile, whereby no growth, such as alga or lint, is accumulated onto the outlet 14 and particularly on the outlet valve 16 of the system.

According to an exemplary embodiment, the outlet 14 of the boiler 10 is arranged such that the exhausted boiling steam is directed to the photovoltaic cell 32, for example, underneath it. With the aid of the arrangement according to the embodiment, it is possible to melt snow or ice accumulated onto the cell 32 with the hot steam. Electricity for heating the cell 32 may be gathered from the power grid # or from an auxiliary battery.

A standard enclosure 30 may be also modified for minimizing risks of an integrated boiler 10 or even utilizing it to benefit the immediate surroundings of the enclosure. For example, the part of the enclosure featuring the boiler may be equipped with a multilayer outer wall (not shown) for maintaining the outer surface thereof cool. This can be arranged by leading the exhaust steam of the boiler via the outlet to a space between the enclosure wall layers. A further space filled with air between wall layers provided superposed on the 'steam gap' would isolate the outermost wall layer from the hot steam thus making the structure safer for maintenance personnel.

The exhausted steam may further be utilized by condensing it outside the enclosure by means of known methods, whereby the enclosure may be used for providing relatively clean water at remote locations. The recondensed water may be used for accommodating the maintenance personnel or for watering the surroundings of the enclosure, plants for example. This would be beneficial in applications, where an enclosure for a solar panel is arranged in a desert, where there is on the one hand great abundance of sunlight but on the other hand no shade. In such circumstances energy production is efficient but the sunlight heats the enclosure, wherein the contained electrical components may suffer from reduced life span. As the desert is a hostile environment for plants, they cannot normally be used for providing shade for the enclosure. When, however, recondensed water is used for watering adjacent plants, the shade provided by the plants cool down the enclosure, which has an advantageous effect on the electrical components inside. Obviously, the plants selected for shading the enclosure shall be selected such that the plants shall not shade the solar panel.

According to an exemplary embodiment, the heater 11 of the boiler 10 may also be used for heating the enclosure 30 during cold weather, if the boiler 10 is arranged inside or in terminal connection with the enclosure 30. If the heater 11 is mainly or only used for heating the inner volume of the enclosure 30, the heating will lengthen the life span of the electrical components inside the enclosure 30.

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

TABLE 1

| List of reference numbers. | |
|---|---|
| Number | Part |
| 10 | boiler |
| 11 | heater |
| 12 | receptacle |
| 13 | inlet |
| 14 | outlet |
| 15 | inlet valve |
| 16 | outlet valve |
| 20 | collected moisture |
| 30 | enclosure |
| 31 | inverter |
| 32 | photovoltaic cell |

TABLE 1-continued

| List of reference numbers. | |
|---|---|
| Number | Part |
| 33 | controller |
| 43 | inverter bypass |
| a | energy window |
| b | energy window |
| c | energy window |
| P | power |
| t | time |
| # | power grid |

What is claimed is:

1. A method for reducing an amount of condensed moisture inside an arrangement, the arrangement including an enclosure enclosing at least one piece of electrical equipment which is configured to receive electric power from an external power source supplying output power in a first electrical magnitude range and which feeds electric power to an external power recipient configured to receive electric power from the electrical equipment in a second electrical magnitude range, a boiler configured to collect and exhaust the moisture, the boiler including a receptacle configured to collect condensed moisture from inside the enclosure, means for channeling the condensed moisture from inside the enclosure to the receptacle, heating means arranged to the receptacle for heating the moisture there within, and an outlet configured to exhaust the heated moisture from the receptacle to outside the arrangement, and a controller configured to direct electric power received by the electrical equipment, wherein the method comprises: utilizing electric power received on at least one portion of the first electrical magnitude range outside the second electrical magnitude range for heating the condensed moisture to exhaust the condensed moisture.

2. The method according to claim 1, wherein the enclosure is a substantially closed outdoor container.

3. The method according to claim 2, wherein the moisture is heated to at least the boiling temperature of the moisture.

4. The method according to claim 2, comprising:
    collecting the moisture to a receptacle of a boiler; and
    heating the moisture collected into the receptacle with an electrical heater resistor which is arranged in the boiler.

5. The method according to claim 2, wherein the enclosure is waterproof.

6. The method according to claim 1, wherein the moisture is heated to at least a boiling temperature of the moisture.

7. The method according to claim 6, comprising:
    collecting the moisture to a receptacle of a boiler; and
    heating the moisture collected into the receptacle with an electrical heater resistor which is arranged in the boiler.

8. The method according to claim 1, comprising:
    collecting the moisture to a receptacle of a boiler; and
    heating the moisture collected into the receptacle with an electrical heater resistor which is arranged in the boiler.

9. The method according to claim 8, wherein the moisture inside the enclosure is collected to the receptacle through an inlet valve in an open position, the receptacle being provided with means for heating the collected moisture, and
    wherein moisture is exhausted from inside the enclosure to outside thereof via the receptacle.

10. The method according to claim 9, wherein the inlet valve is closed for exhausting the heated moisture to outside the enclosure, and
    wherein the heated moisture is exhausted to outside the enclosure through an outlet valve in an open position.

11. The method according to claim 1, wherein the electrical magnitude is at least one of voltage, current, power, frequency and any combination thereof.

12. The method according to claim 1, wherein the at least one piece of electrical equipment includes an inverter configured to convert electric power received form an external solar panel.

13. The method according to claim 1, comprising:
recondensing the exhausted steam outside the enclosure for watering plants outside the enclosure so that the plants provide shade for the enclosure.

14. An arrangement for reducing an amount of condensed moisture, the arrangement comprising:
an enclosure enclosing at least one piece of electrical equipment which is configured to receive electric power from an external power source supplying output power in a first electrical magnitude range and to feed electric power to an external power recipient being configured to receive electric power from the electrical equipment in a second electrical magnitude range;
a boiler configured to collect and exhaust the moisture, the boiler comprising:
a receptacle configured to collect condensed moisture from inside the enclosure;
means for channeling the condensed moisture from inside the enclosure to the receptacle;
heating means arranged to the receptacle for heating the moisture there within; and
an outlet configured to exhaust the heated moisture from the receptacle to outside the arrangement; and
a controller which is configured to direct electric power received by the electrical equipment on at least one portion of the first electrical magnitude range being outside the second electrical magnitude range for heating the condensed moisture for exhaustion thereof.

15. The arrangement according to claim 14, wherein the outlet includes a valve configured to control the exhaustion of moisture from the receptacle.

16. The arrangement according to claim 15, wherein at least one of the valves is/are controllable solenoid valves which are controlled by the controller.

17. The arrangement according to claim 16, comprising:
an external solar panel which is configured to supply the inverter with electric power in the first electrical magnitude range,
wherein the inverter is configured to feed electric power to outside the enclosure in the second electrical magnitude range.

18. The arrangement according to claim 17, wherein electrical magnitude is at least one of voltage, current, power, frequency and any combination thereof.

19. The arrangement according to claim 16, wherein the enclosure is a substantially closed outdoor container.

20. The arrangement according to claim 16, wherein electrical magnitude is at least one of voltage, current, power, frequency and any combination thereof.

21. The arrangement according to claim 15, wherein the enclosure is a substantially closed outdoor container.

22. The arrangement according to claim 15, wherein the at least one piece of equipment includes an inverter for a solar panel.

23. The arrangement according to claim 15, wherein electrical magnitude is at least one of voltage, current, power, frequency and any combination thereof.

24. The arrangement according to claim 14, wherein the means for channeling the condensed moisture from inside the enclosure to the receptacle includes an inlet having a valve for controlling the reception of moisture into the receptacle.

25. The arrangement according to claim 24, wherein the enclosure is a substantially closed outdoor container.

26. The arrangement according to claim 24, wherein the at least one piece of equipment includes an inverter for a solar panel.

27. The arrangement according to claim 24, wherein electrical magnitude is at least one of voltage, current, power, frequency and any combination thereof.

28. The arrangement according to claim 14, wherein the enclosure is a substantially closed outdoor container.

29. The arrangement according to claim 28, wherein electrical magnitude is at least one of voltage, current, power, frequency and any combination thereof.

30. The arrangement according claim 14, wherein the at least one piece of equipment includes an inverter for a solar panel.

31. The arrangement according to claim 30, wherein electrical magnitude is at least one of voltage, current, power, frequency and any combination thereof.

32. The arrangement according to claim 14, wherein the electrical magnitude is at least one of voltage, current, power, frequency and any combination thereof.

33. The arrangement according to claim 14, wherein the enclosure is waterproof.

* * * * *